(12) United States Patent
Basker et al.

(10) Patent No.: US 9,691,763 B2
(45) Date of Patent: *Jun. 27, 2017

(54) MULTI-GATE FINFET SEMICONDUCTOR DEVICE WITH FLEXIBLE DESIGN WIDTH

(71) Applicant: International Business Machines Corporation, Armonk, NY (US)

(72) Inventors: Veeraraghavan S. Basker, Schenectady, NY (US); Tenko Yamashita, Schenectady, NY (US); Chun-chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 26 days.

This patent is subject to a terminal disclaimer.

(21) Appl. No.: 14/141,593

(22) Filed: Dec. 27, 2013

(65) Prior Publication Data

US 2015/0187766 A1    Jul. 2, 2015

(51) Int. Cl.
*H01L 29/66* (2006.01)
*H01L 27/12* (2006.01)
*H01L 29/76* (2006.01)
*H01L 27/088* (2006.01)
(Continued)

(52) U.S. Cl.
CPC .. *H01L 27/0886* (2013.01); *H01L 21/823431* (2013.01); *H01L 29/41783* (2013.01); *H01L 29/66484* (2013.01); *H01L 29/66795* (2013.01)

(58) Field of Classification Search
CPC ............. H01L 29/66795; H01L 29/785; H01L 29/7831; H01L 29/00; H01L 29/80; H01L 29/8083; H01L 29/66878; H01L 29/812; H01L 29/1029; H01L 21/23412; H01L 29/66416; H01L 29/7722
USPC ......... 257/365, 213, 266, E21.179; 438/174, 438/195–195
See application file for complete search history.

(56) References Cited

U.S. PATENT DOCUMENTS 6,642,090 B1   11/2003   Fried et al.
6,909,147 B2   6/2005    Aller et al.
7,348,642 B2   3/2008    Nowak
(Continued)

OTHER PUBLICATIONS

Gu et al., "Width quantization aware FinFET circuit design," IEEE Custom Integrated Circuits Conference, CICC'06, 2006, pp. 337-340.
(Continued)

*Primary Examiner* — Thao X Le
*Assistant Examiner* — Nduka Ojeh
(74) *Attorney, Agent, or Firm* — Cantor Colburn LLP; Vazken Alexanian

(57) ABSTRACT

A semiconductor device includes a substrate extending in a first direction to define a substrate length and a second direction perpendicular to the first direction to define a substrate width. A first semiconductor fin is formed on an upper surface of the substrate. The first semiconductor fin extends along the second direction at a first distance to define a first fin width. A second semiconductor fin is formed on the upper surface of the substrate. The second semiconductor fin extends along the second direction at a second distance to define a second fin width. The second distance may be different with respect to the first distance such that the first and second fin widths are different with respect to one another.

16 Claims, 21 Drawing Sheets

(51) Int. Cl.
*H01L 29/417* (2006.01)
*H01L 21/8234* (2006.01)

(56) References Cited

U.S. PATENT DOCUMENTS

| | | |
|---|---|---|
| 7,544,994 B2 | 6/2009 | Schepis et al. |
| 7,638,843 B2 | 12/2009 | Xiong et al. |
| 7,687,339 B1 | 3/2010 | Schultz et al. |
| 7,709,303 B2 | 5/2010 | Burnett et al. |
| 7,902,603 B2 | 3/2011 | Matsuo |
| 2004/0217430 A1* | 11/2004 | Chu ............... H01L 21/2807 257/410 |
| 2004/0222477 A1 | 11/2004 | Aller et al. |
| 2008/0203468 A1 | 8/2008 | Cheng et al. |
| 2009/0057780 A1 | 3/2009 | Wong et al. |
| 2009/0200604 A1 | 8/2009 | Chidambarrao et al. |
| 2009/0206374 A1* | 8/2009 | Anderson et al. ............ 257/270 |
| 2009/0218603 A1* | 9/2009 | Brask et al. ................. 257/255 |
| 2009/0309162 A1 | 12/2009 | Baumgartner et al. |
| 2011/0175166 A1* | 7/2011 | Bedell ................. H01L 21/845 257/351 |
| 2011/0227145 A1* | 9/2011 | Renn ................ H01L 27/10823 257/328 |
| 2012/0056264 A1* | 3/2012 | Anderson ......... H01L 29/66795 257/347 |
| 2012/0126326 A1 | 5/2012 | Wang et al. |
| 2012/0235247 A1 | 9/2012 | Cai et al. |
| 2012/0313169 A1* | 12/2012 | Wahl ............... H01L 21/823431 257/347 |

OTHER PUBLICATIONS

Nowak et al., "Turning silicon on its edge," IEEE Circuits and Devices Magazine, vol. 20, No. 1, 2004, pp. 20-31.
Rasouli et al., "Design optimization of FinFET domino logic considering the width quantization property," IEEE Transactions on Electron Devices, vol. 57, No. 11, 2010, pp. 2934-2943.
Sachid et al., "Denser and more stable FinFET SRAM using multiple fin heights," International Semiconductor Device Research Symposium (ISDRS), 2011, 2 pages.
Yang et al., "Analysis of parasitic resistance in double gate FinFETs with different fin lengths," 2011 IEEE International SOI Conference (SOI), 2011, 2 pages.
International Search Report and Written Opinion; International Application No. PCT/US2014/060243; International Filing Date: Oct. 13, 2014; Date of Mailing: Jan. 27, 2015; 10 pages.

\* cited by examiner

US 9,691,763 B2

MULTI-GATE FINFET SEMICONDUCTOR DEVICE WITH FLEXIBLE DESIGN WIDTH

BACKGROUND

The present invention relates to semiconductor devices, and more specifically, to FinFET semiconductor devices.

Conventional multi-gate FinFET semiconductor devices include one or more semiconductor fins that extend along the length of the FinFET device ($l_{eff}$) to define a fin length. A fin width ($w_{fin}$) extends perpendicular to the fin length. A gate channel having a gate length ($l_{GATE}$) is defined between a source (S) region and a drain (D) region. The source region (S), gate channel ($l_{GATE}$), and drain region (D) are typically formed planar with one another. The current flows parallel to $l_{eff}$ between the source (S) region and the drain (D) region. To achieve higher drive currents, conventional FinFET devices may include multiple fins formed parallel to one another along the width ($w_{eff}$) of the FinFET device as illustrated in FIG. 1. Thus, as the demand to drive higher currents increases, it is necessary to form additional fins on the substrate. The formation of additional fins, however, increases the overall $w_{eff}$. Conventional FinFET devices are typically limited to the integral multiple of the fin height ($h_{FIN}$), for example, twice the height of the fin ($2 \times h_{FIN}$). Accordingly, the width quantization is an inherent constraint of conventional multi-gate FinFET devices.

SUMMARY

According to an exemplary embodiment, a semiconductor device includes a substrate extending in a first direction to define a substrate length and a second direction perpendicular to the first direction to define a substrate width. A first semiconductor fin is formed on an upper surface of the substrate. The first semiconductor fin extends along the second direction at a first distance to define a first fin width. A second semiconductor fin is formed on the upper surface of the substrate. The second semiconductor fin extends along the second direction at a second distance to define a second fin width. The second distance may be different with respect to the first distance such that the first and second fin widths are different with respect to one another.

According to another exemplary embodiment, a method of fabricating a semiconductor device comprises forming a substrate that extends in a first direction to define a substrate length and a second direction perpendicular to the first direction to define a substrate width. The method further comprises forming a first semiconductor fin on an upper surface of the substrate such that the first semiconductor fin extends along the substrate width at a first distance to define a first fin width. The method further comprises forming a second semiconductor fin on the upper surface of the substrate such that the fin extends along the substrate width at a second distance to define a second fin width. The second distance is different with respect to the first distance such that the first and second fin widths are different with respect to one another.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features of the invention are apparent from the following detailed description taken in conjunction with the accompanying drawings. FIGS. 1-15B illustrate a process of flow of fabricating a semiconductor device in which:

FIG. 1 is an isometric view of a conventional FinFET semiconductor device;

FIG. 2 is a cross sectional view of a starting substrate according to an exemplary embodiment;

FIG. 3 is a cross sectional view of the starting substrate illustrated in FIG. 2 following a masking deposition process that deposits a hardmask layer on an upper surface of the starting substrate;

FIG. 4 is a cross sectional view of the substrate illustrated in FIG. 3 following a mandrel deposition process that deposits a mandrel layer on an upper surface of the hardmask layer;

FIG. 6 is cross sectional view of the substrate illustrated in FIGS. 5A and 5B following a mandrel pull process that removes the mandrels from between the spacers;

FIG. 7 is cross sectional view of the substrate illustrated in FIG. 6 following an etching process that etches the hardmask layer and underlying substrate to form individual semiconductor fins;

FIG. 9 is a cross sectional view of the substrate illustrated in FIGS. 8A and 8B following a block mask deposition process that deposits a block mask that covers exposed portions of the substrate and the semiconductor fins;

FIG. 10 is a cross sectional view of the substrate illustrated in FIG. 9 following a selective patterning process that exposes a single semiconductor fin and a portion of the substrate;

FIG. 11 is a cross sectional view of the substrate illustrated in FIG. 10 undergoing an ion implantation process that implants doped ions into a portion of the exposed substrate and a portion of the exposed semiconductor fin;

FIG. 12 is a cross sectional view of the substrate illustrated in FIG. 11 illustrating source/drain junctions formed in the exposed substrate and exposed semiconductor fin following the ion implantation process;

FIG. 15B is an isometric view of substrate illustrated in FIG. 14A illustrating the individual gate stacks extending along the fin widths.

DETAILED DESCRIPTION

Figure 2:
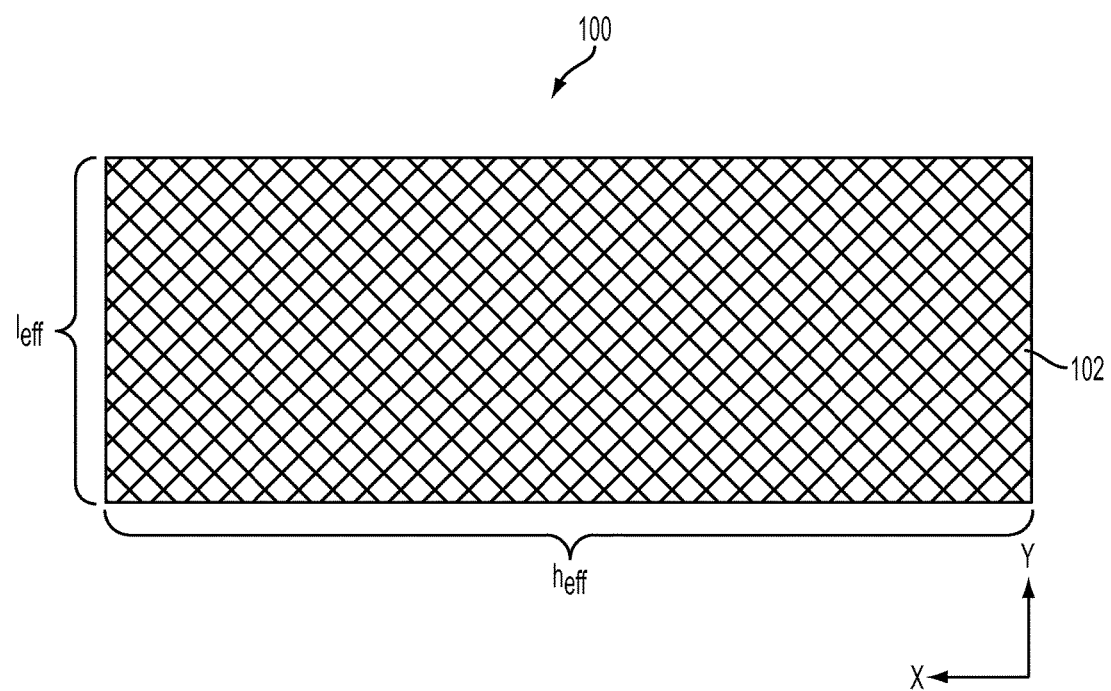

Referring to FIG. 2, a semiconductor structure 100 includes a bulk semiconductor substrate 102 extending along an X-axis to define a height, and a Y-axis perpendicular to the X-axis to define a length. The bulk semiconductor substrate 102 may be formed from a semiconductor material such as silicon (Si), for example.

Figure 3:
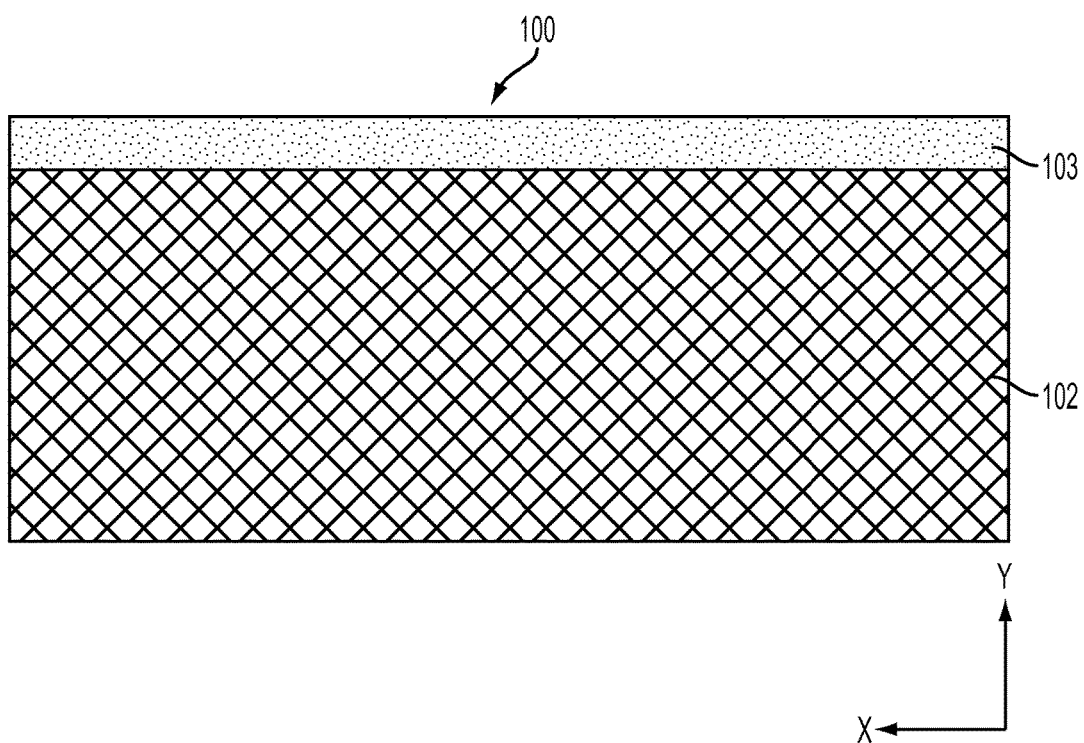

Turing to FIG. 3, a hardmask layer 103 is formed on an upper surface of the bulk semiconductor substrate 102. The hardmask layer 103 may be formed using chemical vapor deposition (CVD) and may be formed from a nitride mask material as understood by those ordinarily skilled in the art.

Figure 4:
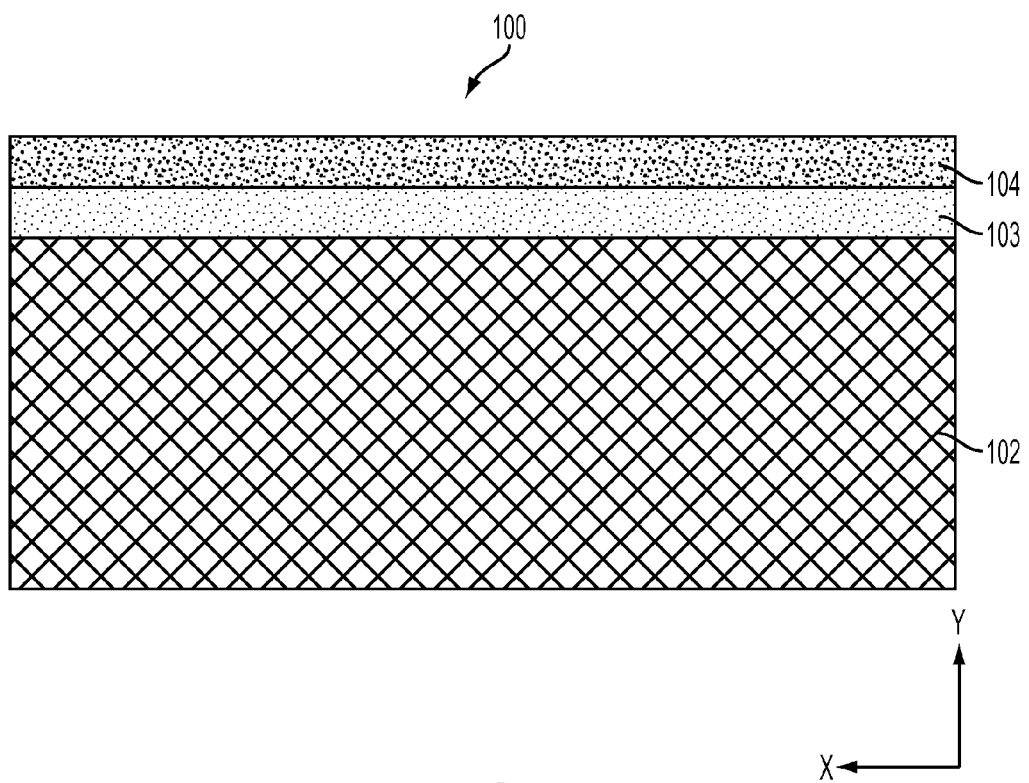

Referring to FIG. 4, a mandrel layer 104 is formed on an upper surface of the hardmask layer 103. The mandrel layer 104 can be formed by CVD of silicon oxide ($SiO_2$). Further, the mandrel layer 104 may be formed from a material having a composition different from the hardmask layer 103 to achieve an etching selectivity. The material of the mandrel layer 104 includes, but is not limited to, photoresist, polycrystalline silicon, silicon oxide, silicon nitride, and silicon germanium.

Figure 5A:
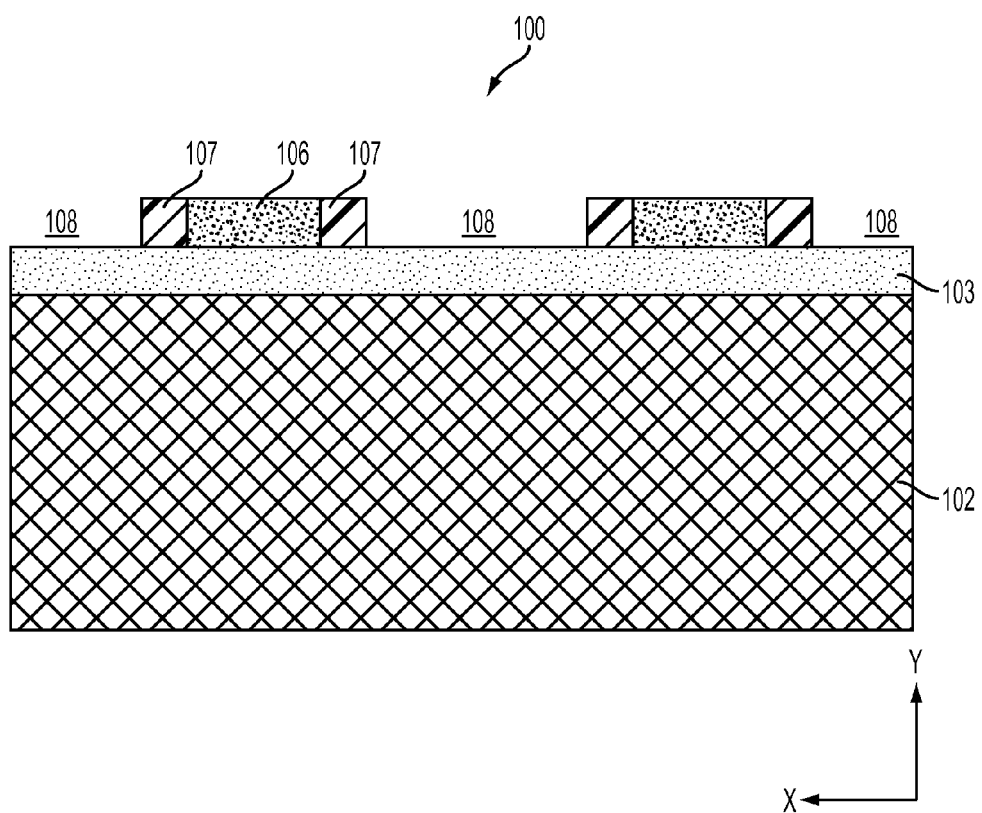
FIG. 5A is a cross sectional view of the substrate illustrated in FIG. 4 after patterning the mandrel layer to form individual mandrels and after forming spacers on opposing sides of each mandrel.
Figure 5B:
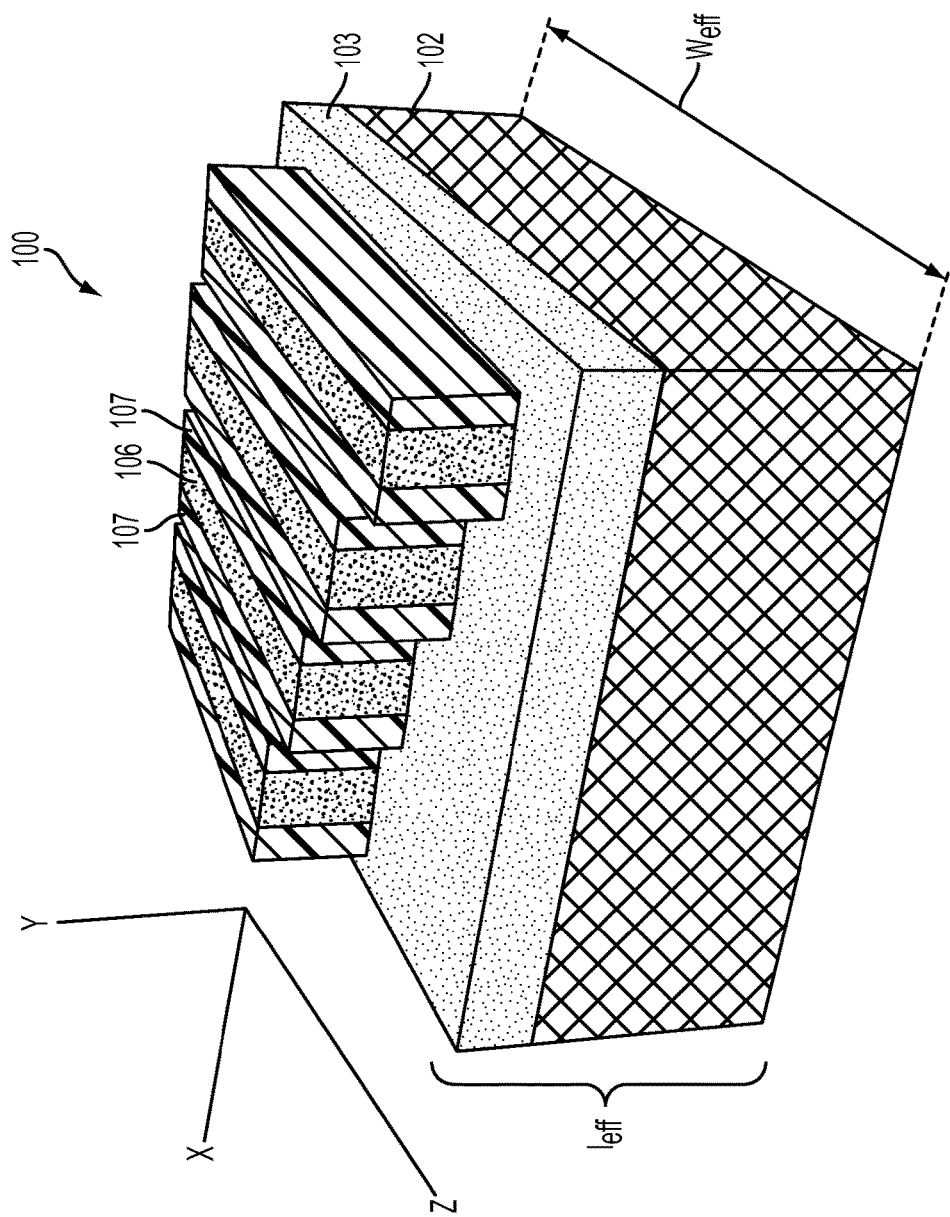
FIG. 5B is an isometric view of the substrate illustrated in FIG. 5A illustrating mandrels and spacers extending along a width of the substrate.

Referring now to FIG. 5A, the mandrel layer 104 is patterned to form a plurality of individual mandrels 106. One or more portions of the mandrel layer 104 may be patterned using various processes including but not limited to, lithography, to form a one or more trenches 108. Accordingly, each individual mandrel 106 is separated from one another by a trench 108. The mandrel layer 106 may also be patterned to adjust the width of one or more of individual mandrel 106 extending along the Z-axis as illustrated in FIG. 5B. The patterned width of each mandrel 106 may define the width of a respective fin to be formed on the semiconductor device 100, as discussed in greater detail below. Spacers 107 are formed at the sides of each individual mandrel 106. The spacers may be formed using a lithography process and a sidewall image transfer (SIT) process as understood by those ordinarily skilled in the art.

Figure 6:
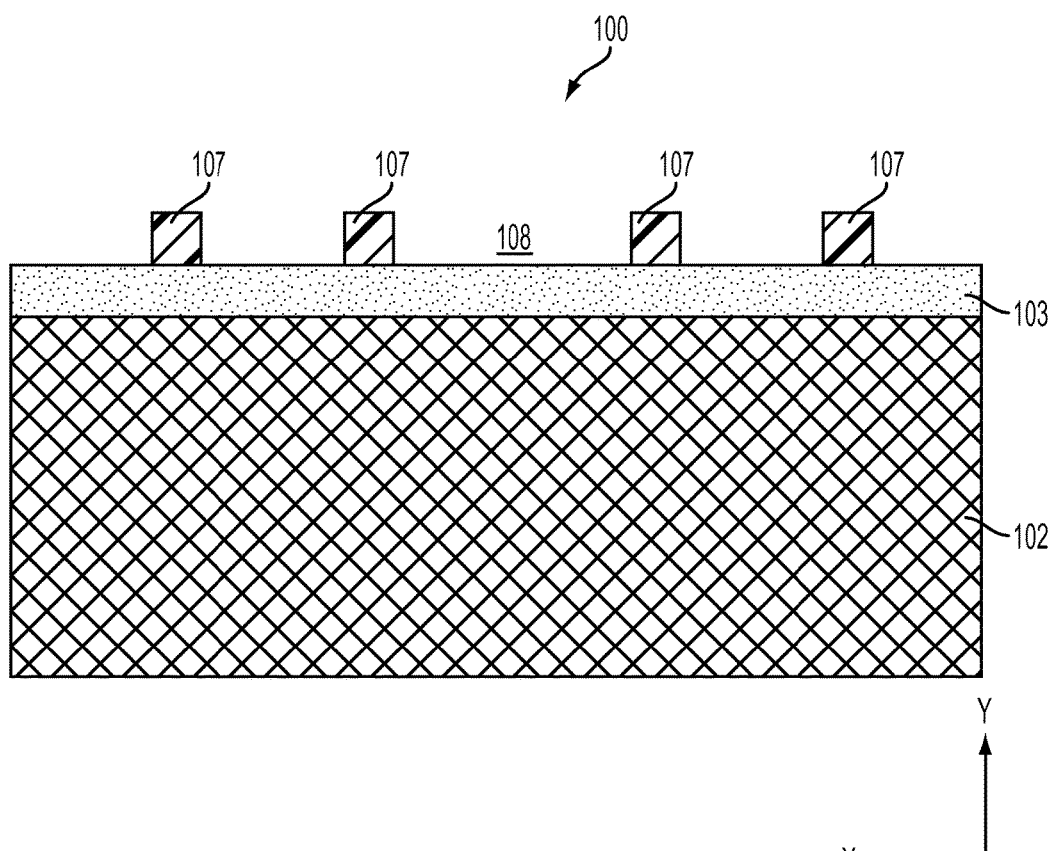

Turning now to FIG. 6, a mandrel pull process is performed that removes the individual mandrels 106. The mandrel pull process creates additional trenches 108 between the individual spacers 107.

Figure 7:
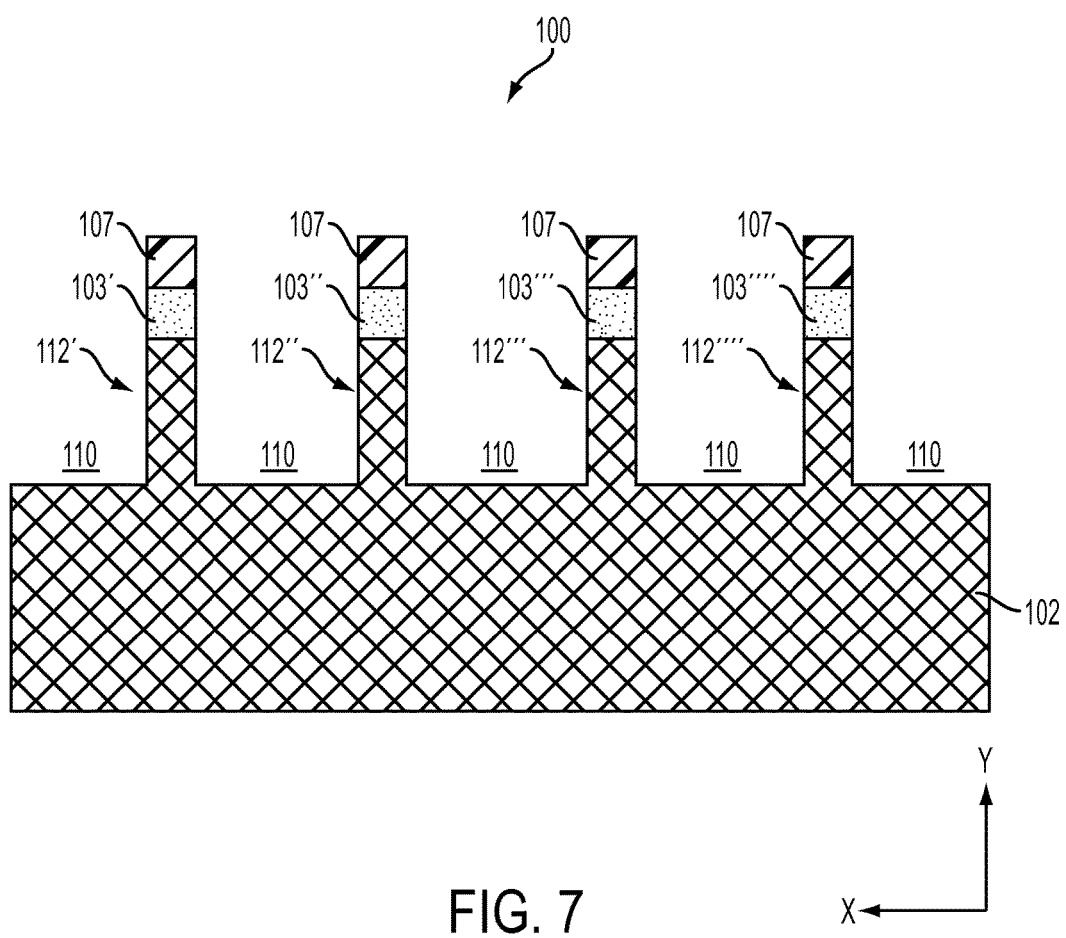

Referring to FIG. 7, the individual spacers 107 may be utilized to etch fin trenches 110 into the bulk semiconductor substrate 102. The fin trenches 110 may be formed using an SIT process as understood by those ordinarily skilled in the art. The etched fin trenches 110 define one or more semiconductor fins 112'-112''''. Since the fins 112'-112'''' are patterned into the bulk semiconductor substrate 102, the fins 112'-112'''' and the semiconductor bulk substrate 102 are formed from the same material, such as Si.

Figure 8A:
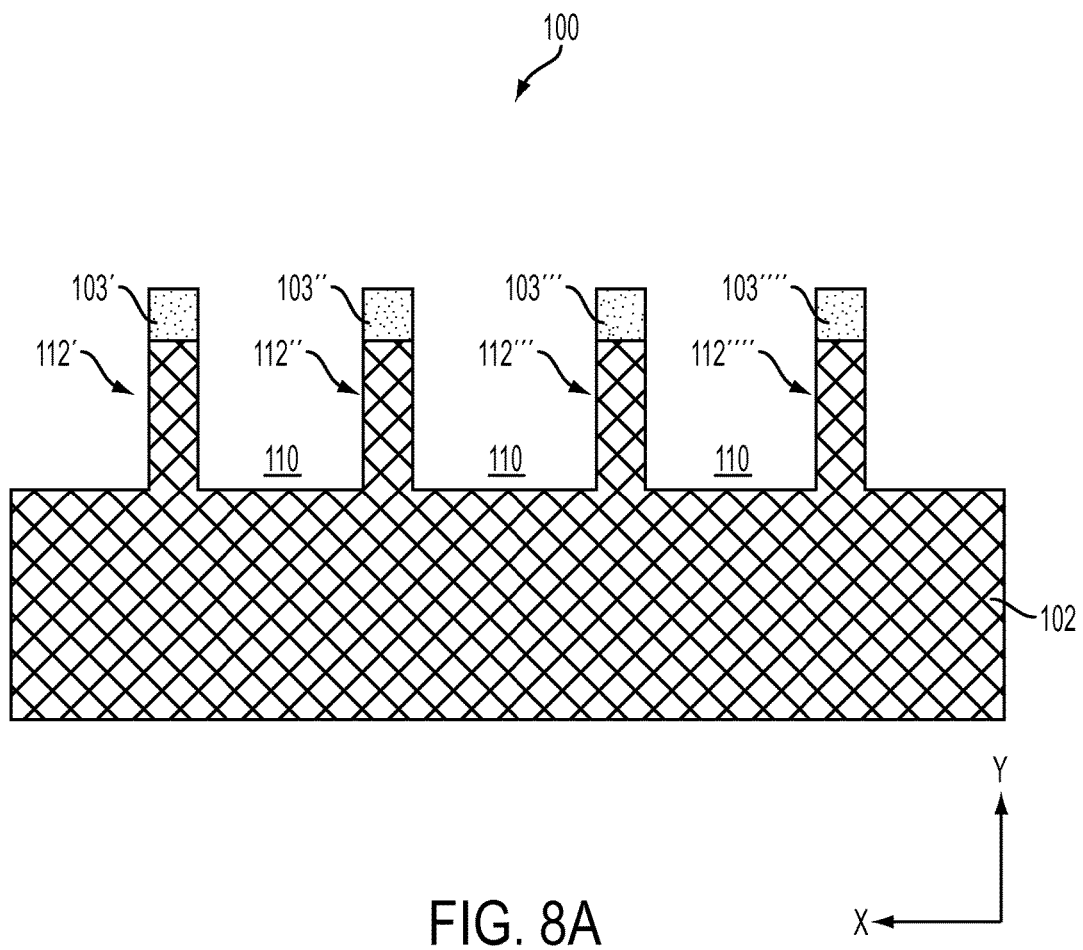
FIG. 8A is a cross sectional view of the substrate illustrated in FIG. 7 following removal of the spacers from the upper surface of each semiconductor fin.
Figure 8B:
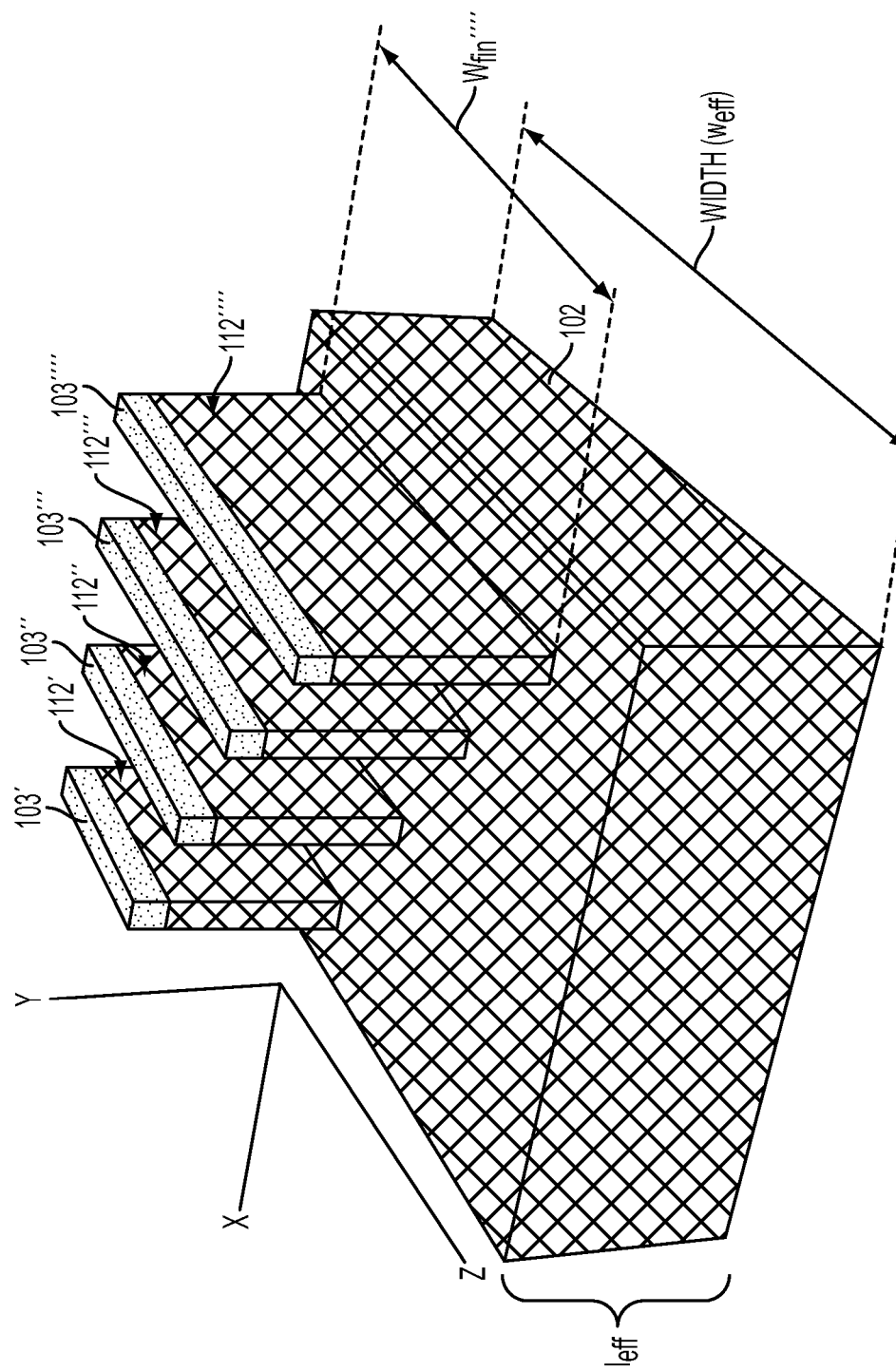
FIG. 8B is an isometric view of the substrate illustrated in FIG. 8A showing the semiconductor fins extending along the width of the substrate at different lengths to define different fin widths with respect to one another.

Turning to FIG. 8A, the individual spacers 107 may be removed thereby exposing individual hardmask caps 103 formed on an upper surface of a respective fin 112'-112''''. The hardmask caps 103 may have a thickness of, for example, approximately 3 nanometers (nm) to 5 nm. Various procedures may be performed to remove the spacers 107 including, but not limited to, an etch chemistry process. The fins 112'-112'''' extend along the Z-axis to define a fin width (wFIN) as illustrated in FIG. 8B. The wFIN of one or more of the fins 112'-112'''' may be defined according to the width of a respective spacer 107. Accordingly, the wFIN of one fin 112'-112'''' may be adjusted with respect to the remaining fins 112'-112''''. Referring to FIG. 8B, for example, a first fin 112' may have a wFIN that is less than a wFIN of a second fin 112''''. Therefore, the semiconductor device 100 may be formed as a multi-gate FinFET having a flexible and adjustable fin width design.

In addition to adjusting $w_{FIN}$ of one or more of the fins 112'-112'''', a gate length of the semiconductor device 100 may also be adjusted by forming source (S) and drain (D) junctions having varying depths. A process flow of forming a multi-gate FinFET having varied gate lengths and S/D junction depths is illustrated in FIGS. 9-15B and is discussed in greater detail below.

Figure 9:
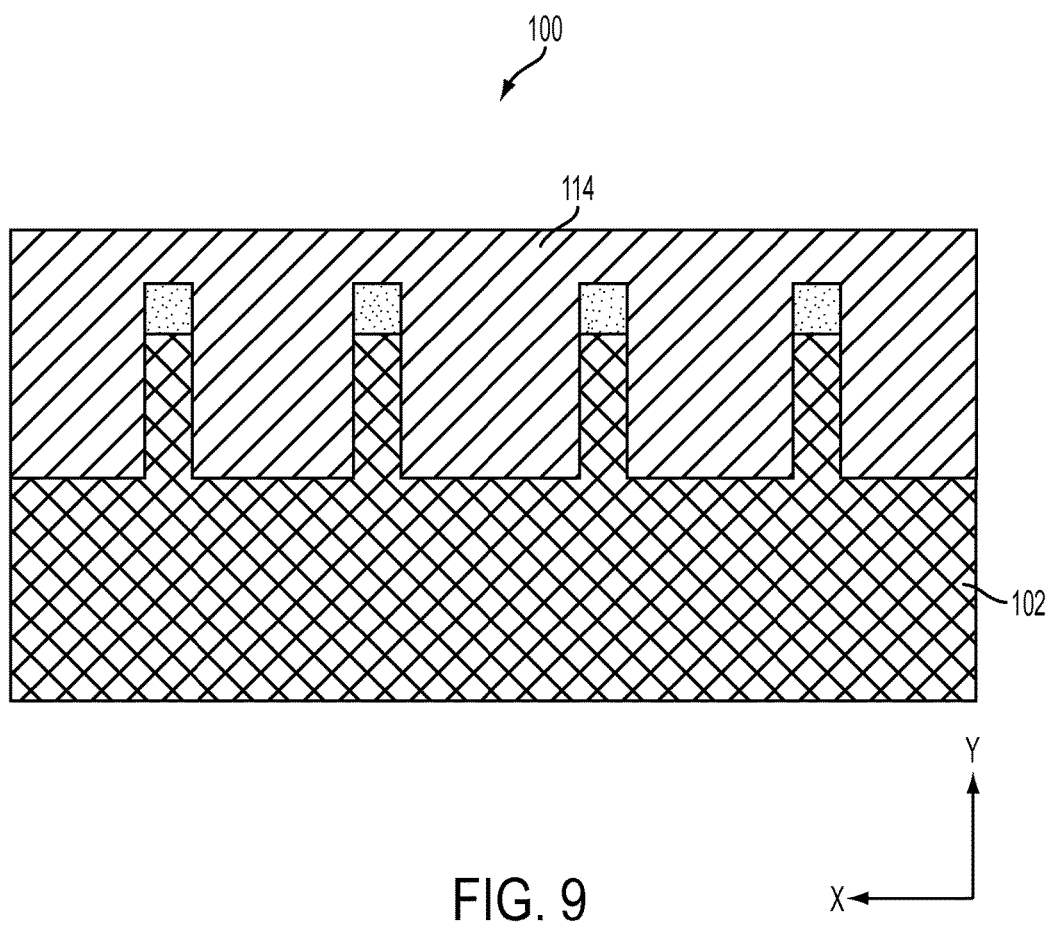

Referring now to FIG. 9, the semiconductor device 100 illustrated in FIGS. 8A-8B undergoes a mask deposition process which deposits a block mask 114 that covers the trenches 110 and the fins 112'-112''''. The block mask 114 is configured to block doping ions from penetrating therethrough and reaching the underlying semiconductor material of the bulk semiconductor substrate 102 and fins 112'-112''''. According to at least one exemplary embodiment, the block mask 114 may be formed from various materials selectable to lithography patterning as understood by those ordinarily skilled in the art.

Figure 10:
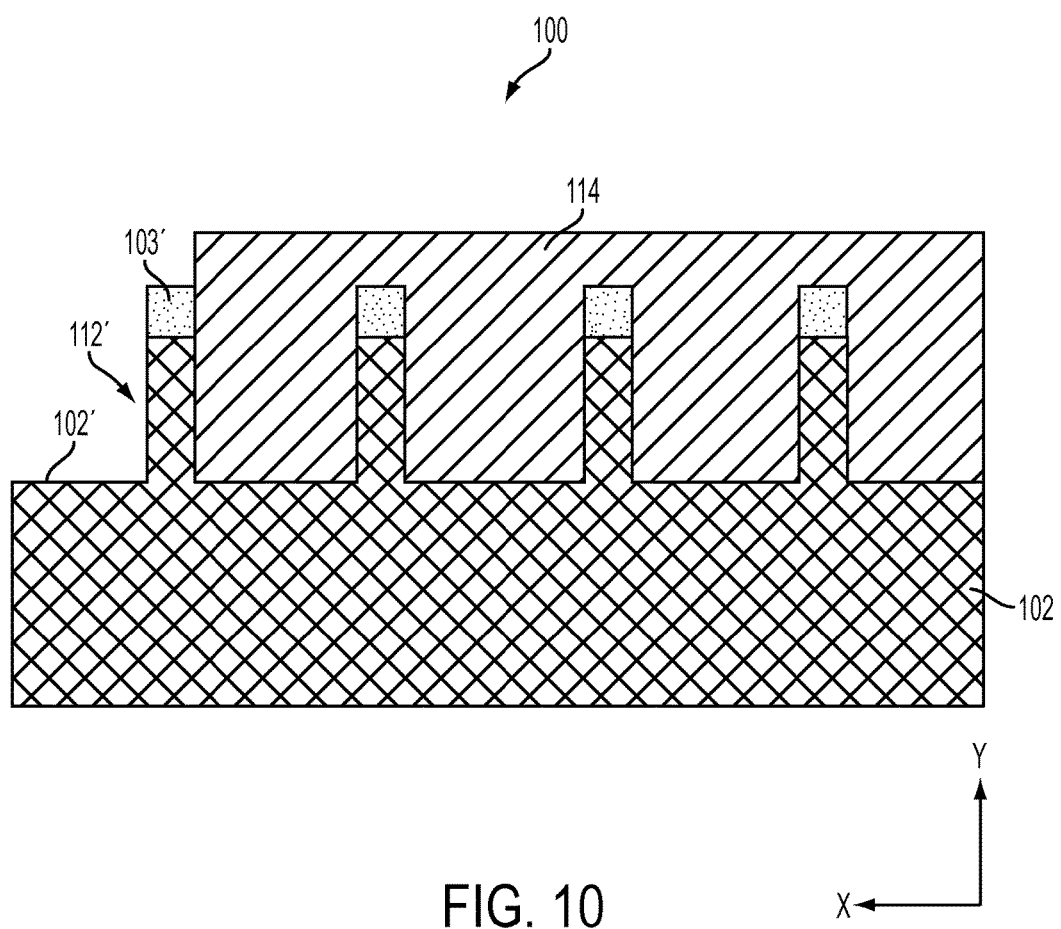

Turning to FIG. 10, a portion of the block mask 114 is patterned to expose a first fin 112' and a first semiconductor substrate portion 102'. Various well-known lithography processes may be used to pattern the block mask 114. Accordingly, only a single fin 112' and selected semiconductor substrate portion 102' are exposed, while the remaining fins 112''-112'''' and remaining bulk semiconductor substrate 102 remains covered by the block mask 114.

Figure 11:
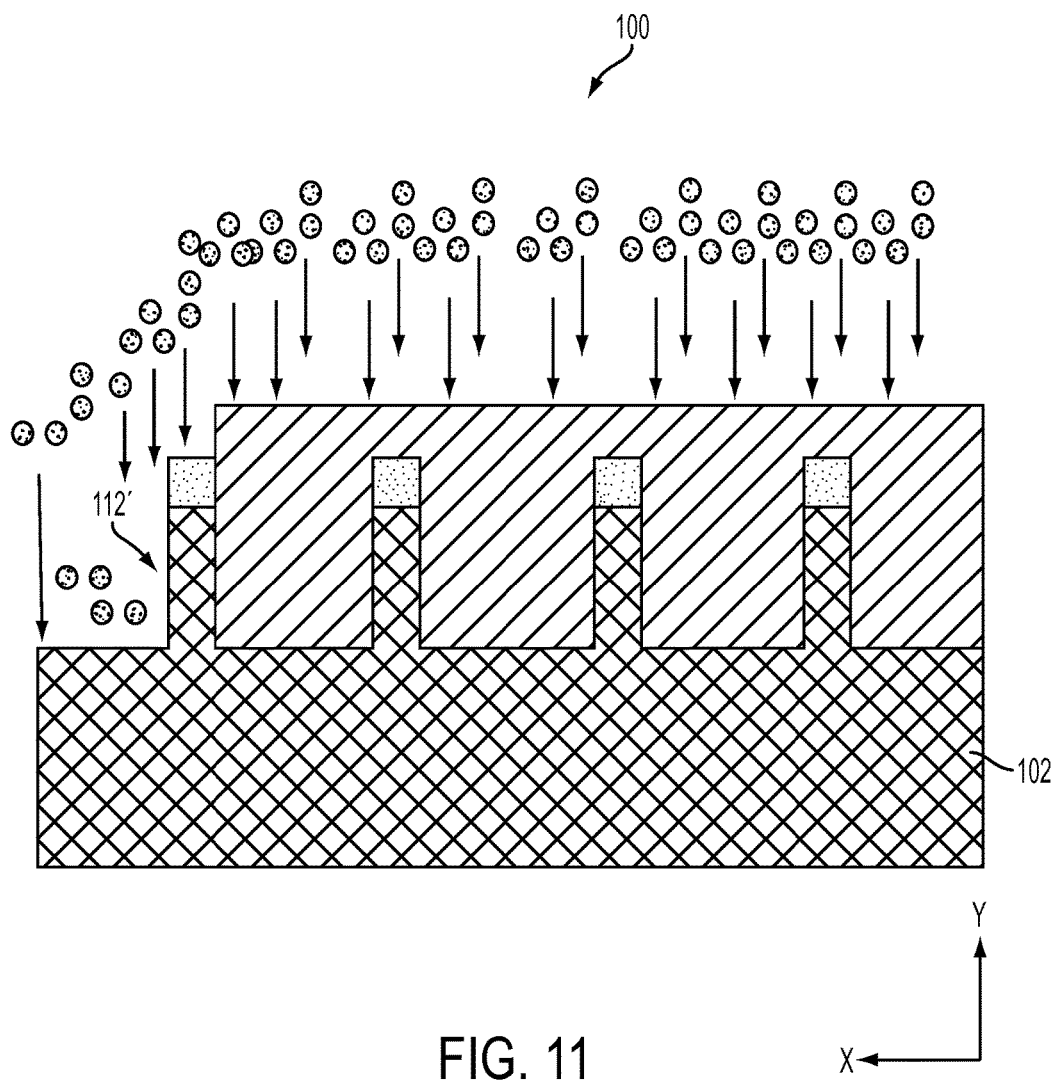

Referring now to FIG. 11, an ion implantation process is applied to the semiconductor device 100 to form source/drain (S/D) junctions. The ions may penetrate through the hardmask caps 103 and may be implanted according to a self-aligned, 0 degree ion implantation process. However, it is appreciated that the ions may be implanted at angles to more precisely form the resulting S/D junctions. The energy level of the ion source may also be adjusted to vary depths at which the ions are implanted in the exposed first fin 112' and first semiconductor substrate portion 102'. The ions selected for the ion implantation process may be selected according to the doping type of the bulk semiconductor substrate 102 and fins 112'-112''. For example, if the bulk semiconductor substrate 102 and fins 112'-112'''' are doped with a P-type material (e.g., phosphorus), the ions may be N-type ions (e.g., boron) to form N-type S/D junctions (i.e., an NFET). If, however, the bulk semiconductor substrate 102 and fins 112'-112'''' are doped with an N-type material (e.g., boron), the ions may be P-type ions (e.g., phosphorus) to form P-type S/D junctions (i.e., a PFET).

Figure 1:
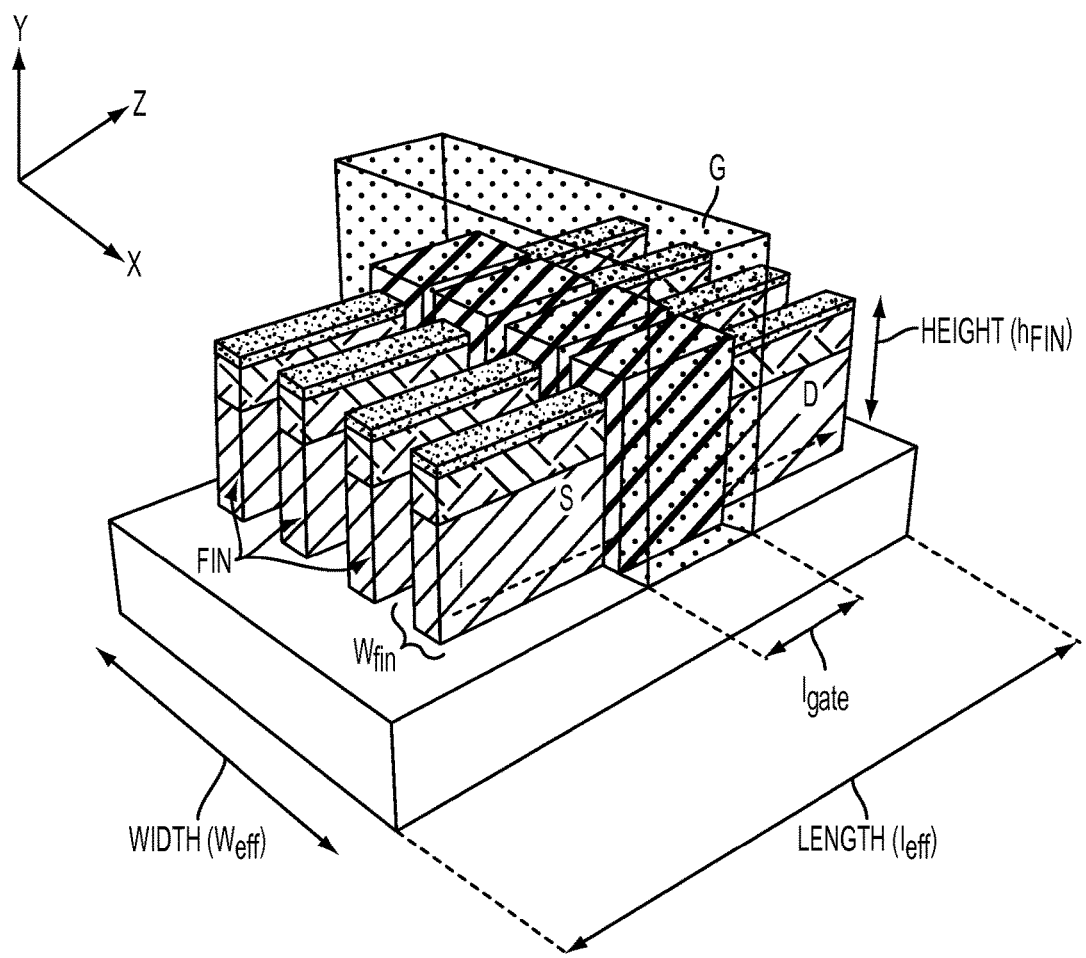
Figure 12:
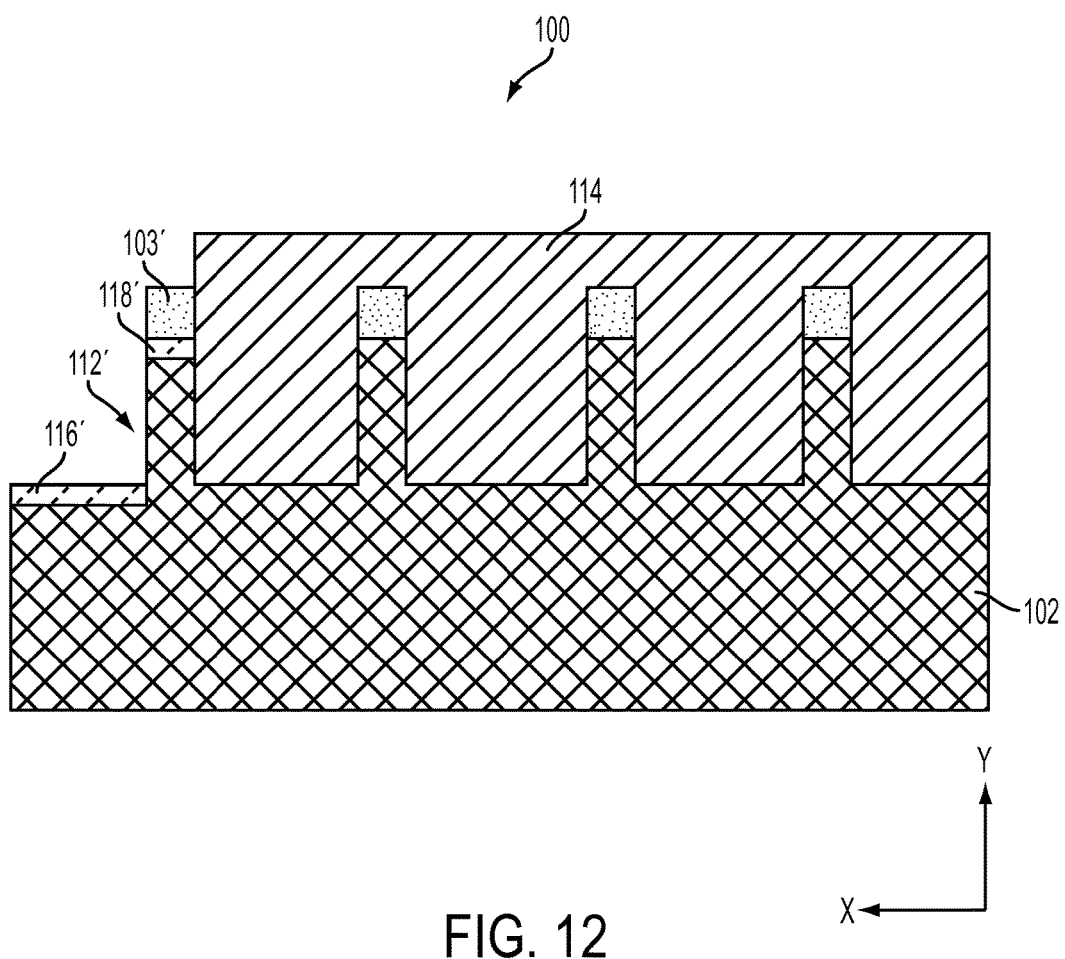

As illustrated in FIG. 12, the ion implantation process forms a source junction 116' and a drain junction 118' corresponding to the first fin 112'. It is appreciated by one of ordinary skill in the art that the locations of the source junction 116' and a drain junction 118' may be interchanged. As further illustrated in FIG. 12, the source junction 116' and the drain junction 118' have a first depth level formed according to the energy level selected for performing the corresponding ion implantation process. Unlike a conventional FinFET device, which forms the source (S) and drain (D) junctions to be planar with respect to one another (see FIG. 1), at least one exemplary embodiment of the invention provides a source junction 116 and a drain junction 118 that is vertically off—set with—respect to one another.

Figure 13A:
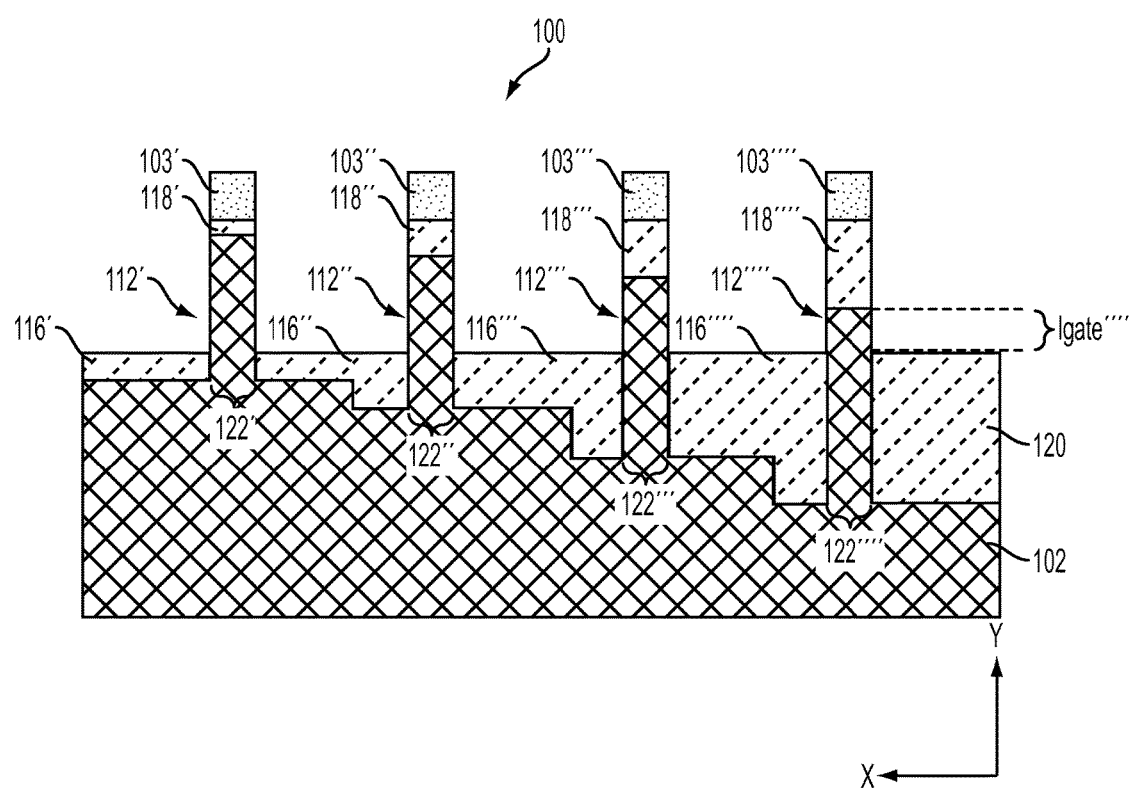
FIG. 13A is a cross sectional view of the substrate illustrated in FIG. 12 following a selective patterning and ion implantation process to form source/drain junctions having varying depths on remaining portions of the substrate and the remaining semiconductor fins.
Figure 13B:
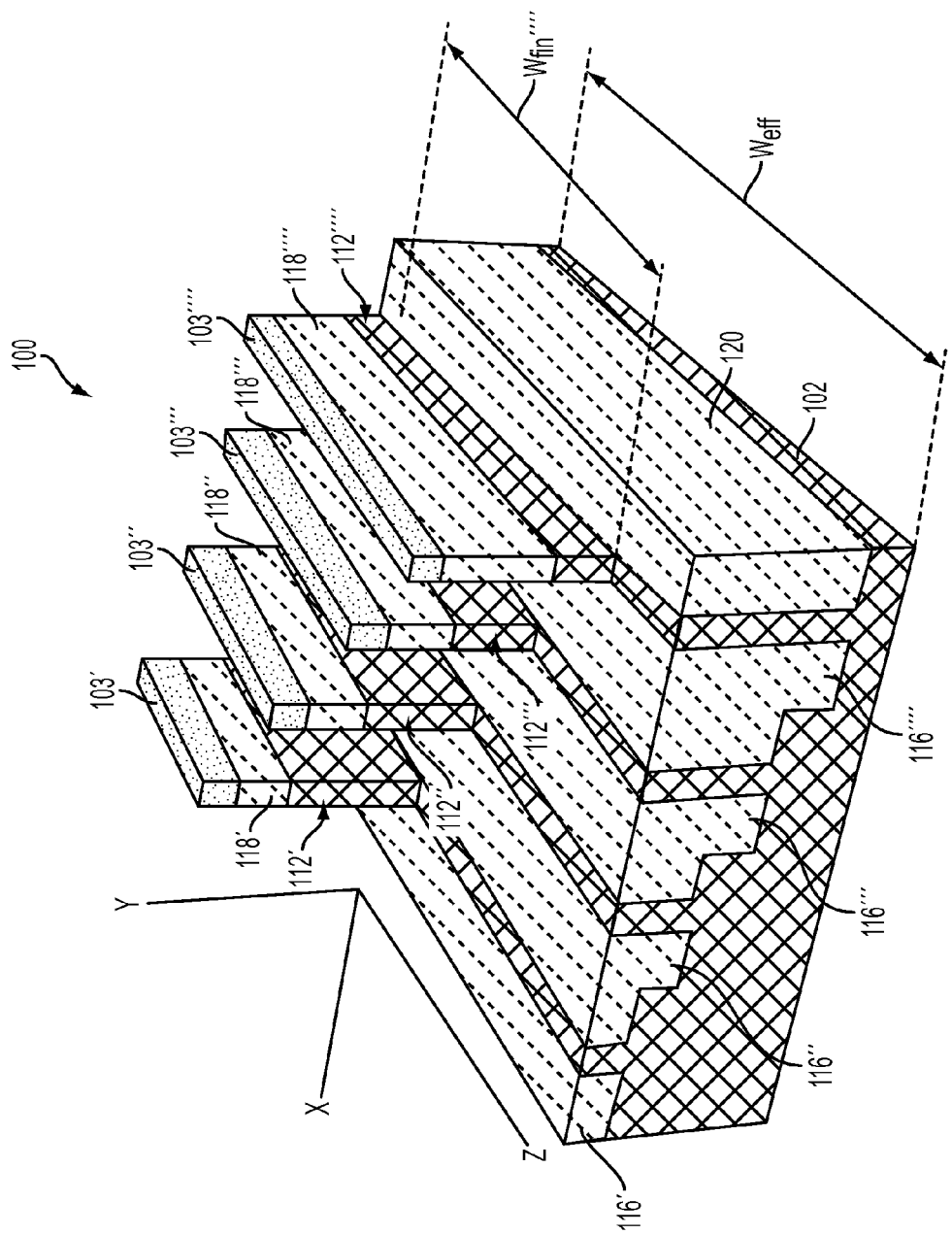
FIG. 13B is an isometric view of the substrate illustrated in FIG. 13A showing the source/drain junctions extending along the width of the substrate and the fin widths.

Turning now to FIGS. 13A and 13B, the semiconductor device 100 is illustrated following multiple ion implantation processes to form source junctions 116'-116"" and drain junctions 118'-118"" corresponding to each fin 112'-112"". It is appreciated by one of ordinary skill in the art, that the S/D junctions corresponding to each fin 112'-112" may be formed by performing multiple block mask deposition and block mask patterning procedures (not shown) as described in detail above. Each block mask deposition and patterning procedure selectively exposes a single fin and corresponding semiconductor substrate portion 102', which are implanted with ions according to the ion implantation process described in detail above. As further illustrated in FIGS. 13A-13B, the energy levels of each ion implantation process may be varied to thereby form S/D junctions having different depth levels with respect to one another. For example, the source junction 116' and the drain junction 118' of the first fin 112' have a first depth level that is shallower than the depth level of the source junction 116''' and the drain junction 118''' of a third fin 112'''.

One or more of the doped S/D junctions may also be utilized as an isolation junction that electrically isolates adjacent fins from one another and/or from remaining portions of the bulk semiconductor substrate 102 to define a gate channel. Still referring to FIGS. 13A-13B, for example, an isolation region 120 is formed in the bulk semiconductor substrate 102.

Referring still to FIGS. 13A-13B, each S/D junction defines a respective gate channel 122'. Conventional multi-gate FinFETs form a gate channel having a channel length that extends parallel (i.e., horizontally along the X-axis) and planar with respect to the S/D junctions (see FIG. 1). Unlike conventional multi-gate FinFETs, at least one embodiment of the invention provides a gate channel 122'-122"" having a channel length that extends vertically along the Y-axis. Therefore, unlike a conventional FinFET device, which forms the gate channel to be parallel and planar between the source (S) and drain (D) junctions (see FIG. 1), at least one embodiment of the invention forms the gate channel 122'-122"" as non-planar and extending perpendicular with respect to at least one of the source junction 116'-116"" and the drain junction 118'-118"".

As further illustrated in FIGS. 13A-13B, the length ($l_{GATE}$) of each gate channel 122'-122"" is defined by the depth level of the respective source junction 116'-116"" and drain junction 118'-118"". That is, the at least one exemplary embodiment of the invention provides a multi-gate FinFET with an adjustable $l_{GATE}$. The gate channel length, therefore, is independent with respect to the fin height such that desirable voltage threshold (Vt) shift may be achieved through back biasing. Although the semiconductor device 100 illustrated in FIGS. 13A-13B shows gate channels 122 formed of a common doped material, it is appreciated that one or more of the gate channels may be isolated to form gate channels formed of a different doping material. For example, a first gate channel may be isolated and formed as an N-type semiconductor material to provide a PFET device, while an adjacent gate channel may be formed as a P-type semiconductor material to provide an NFET device. The various types of semiconductor materials may be formed using, for example, ion implantation as understood by those ordinarily skilled in the art.

Figure 14A:
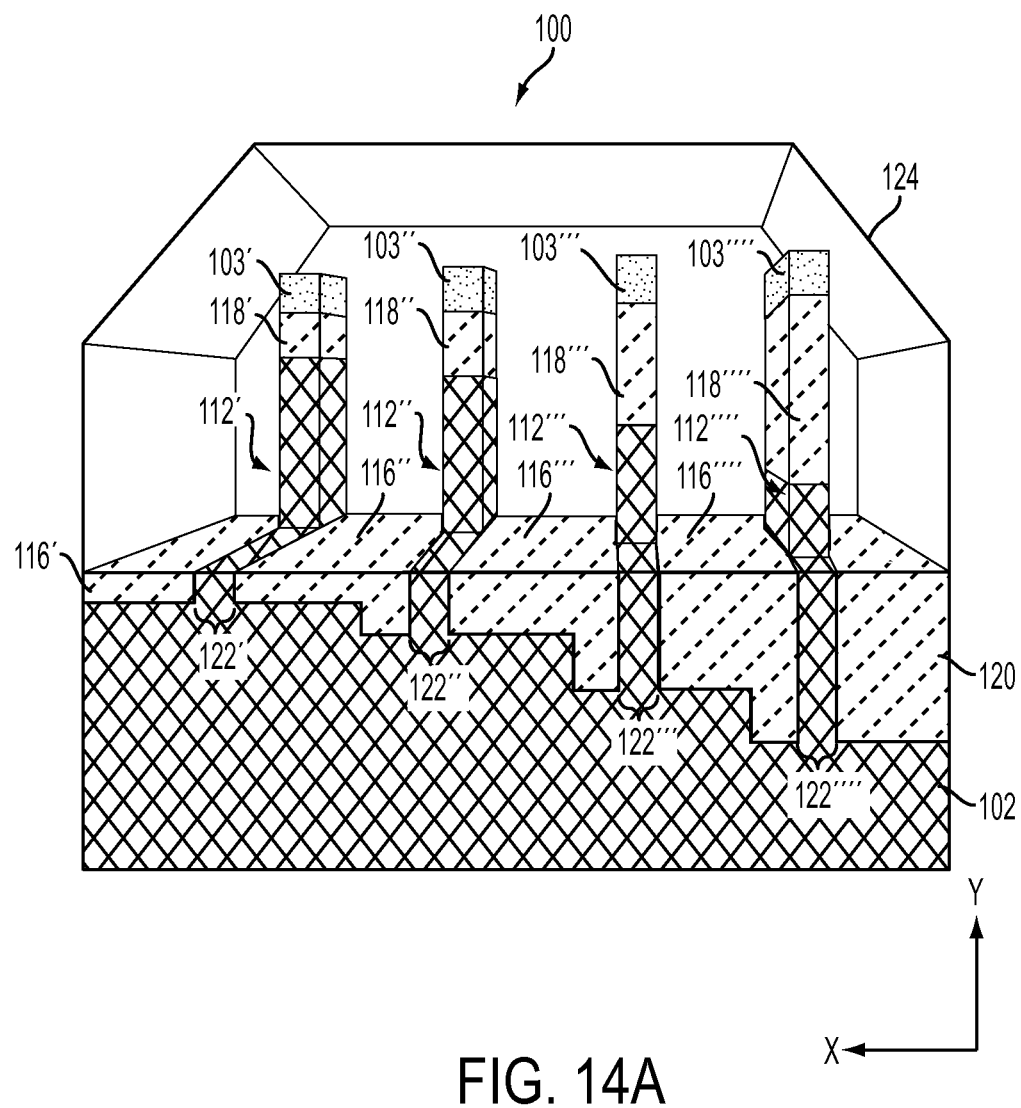
FIG. 14A illustrates the substrate of FIGS. 13A and 13B following deposition of a polysilicon block layer that covers exposed portions of the substrate and the semiconductor fins.
Figure 14B:
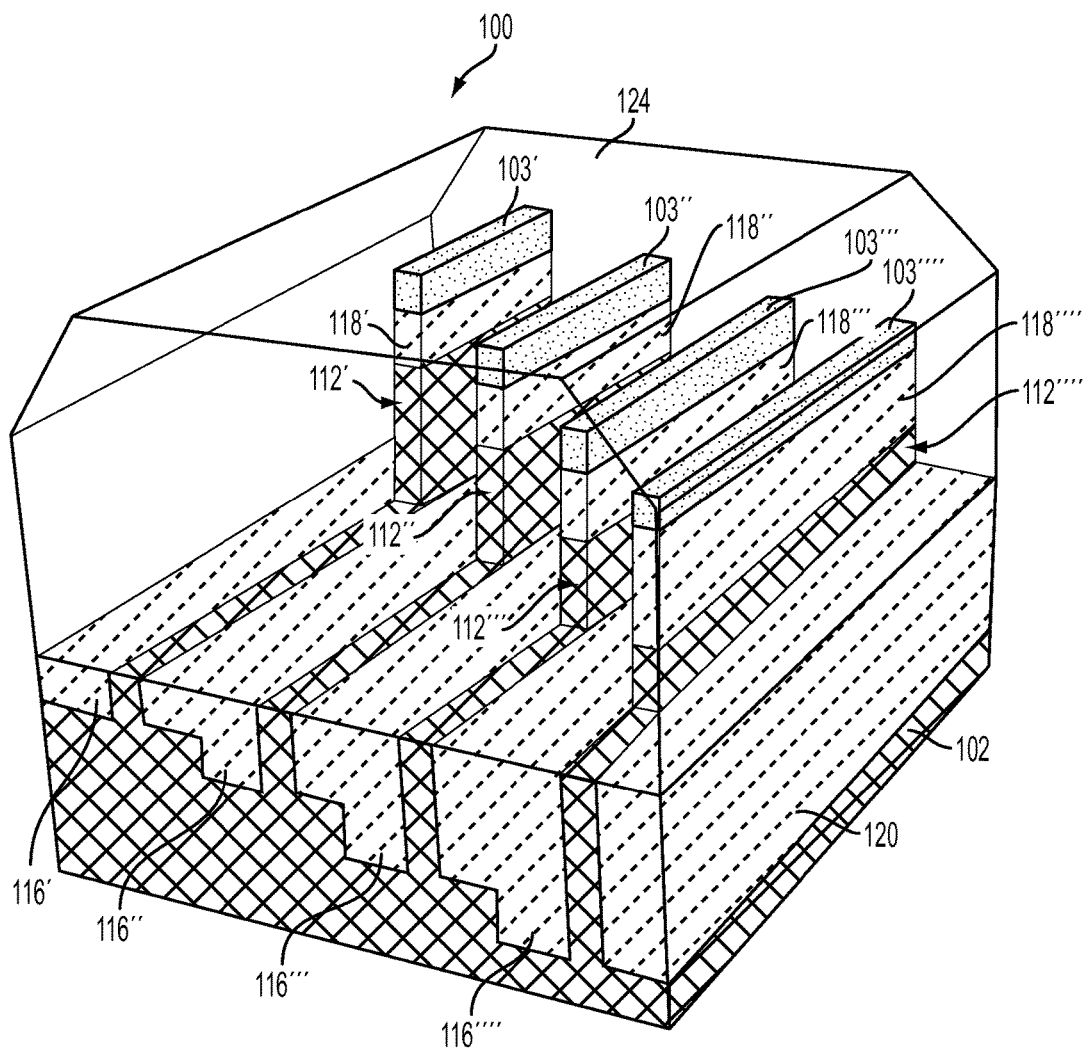
FIG. 14B is an isometric view of the substrate illustrated in FIG. 14A illustrating the polysilicon block layer extending along the width of the substrate.

Referring now to FIGS. 14A-14B, a polysilicon block layer 124 is deposited on an upper surface of semiconductor structure 100. The polysilicon block 124 may cover the gate channel 122'-122"", the source junction 116'-116"", the drain junction 118'-118"", the isolation region 120, and the fins 112'-112"". The polysilicon block layer 124 may be formed from various polysilicon materials configured to form one or more gate stacks as understood by those ordinarily skilled in the art.

Figure 15A:
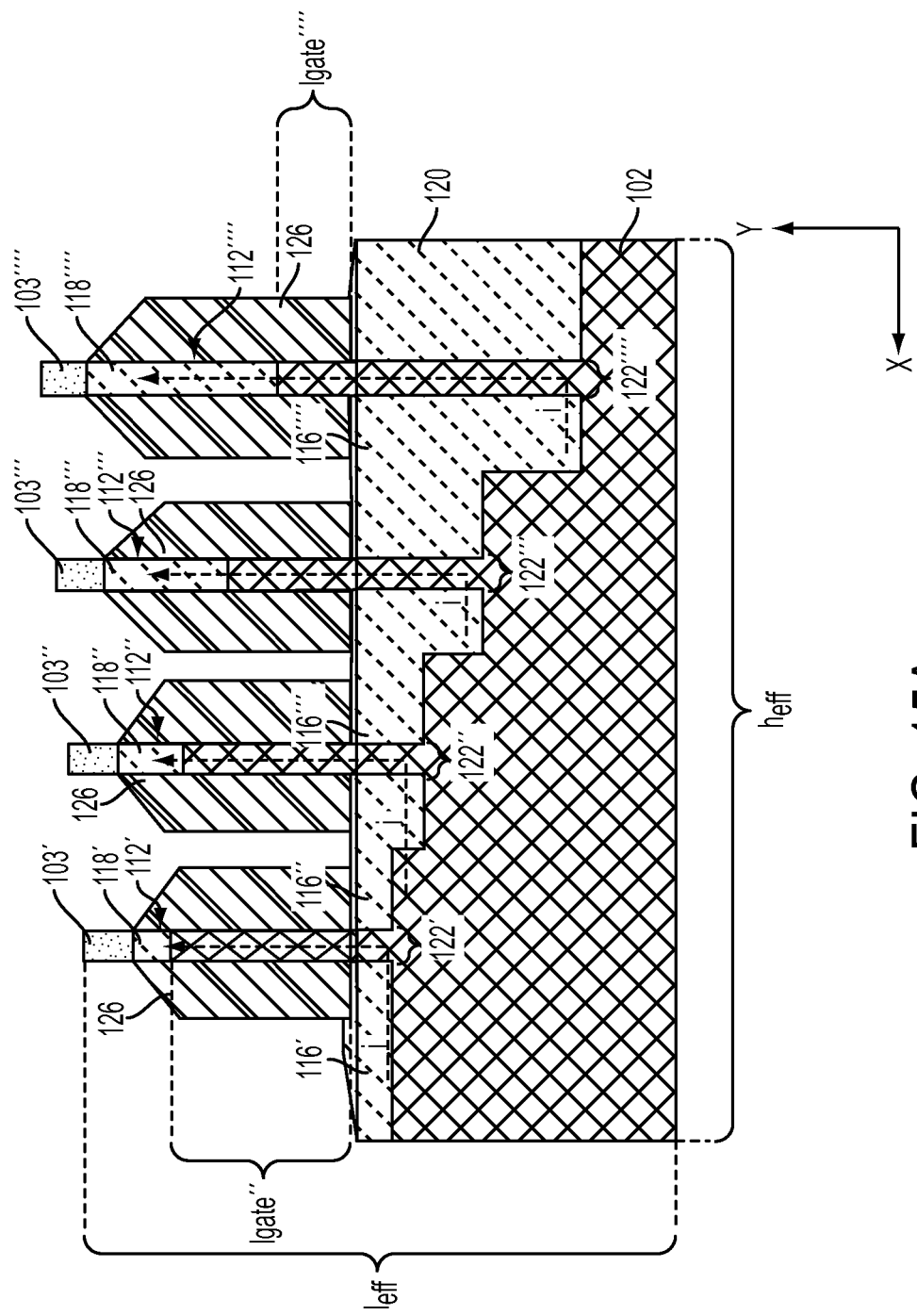
FIG. 15A is a cross-sectional view illustrating the substrate of FIGS. 14A and 14B following a patterning process that patterns the polysilicon block layer to form individual gate stacks on a respective semiconductor fin.
Figure 15B:
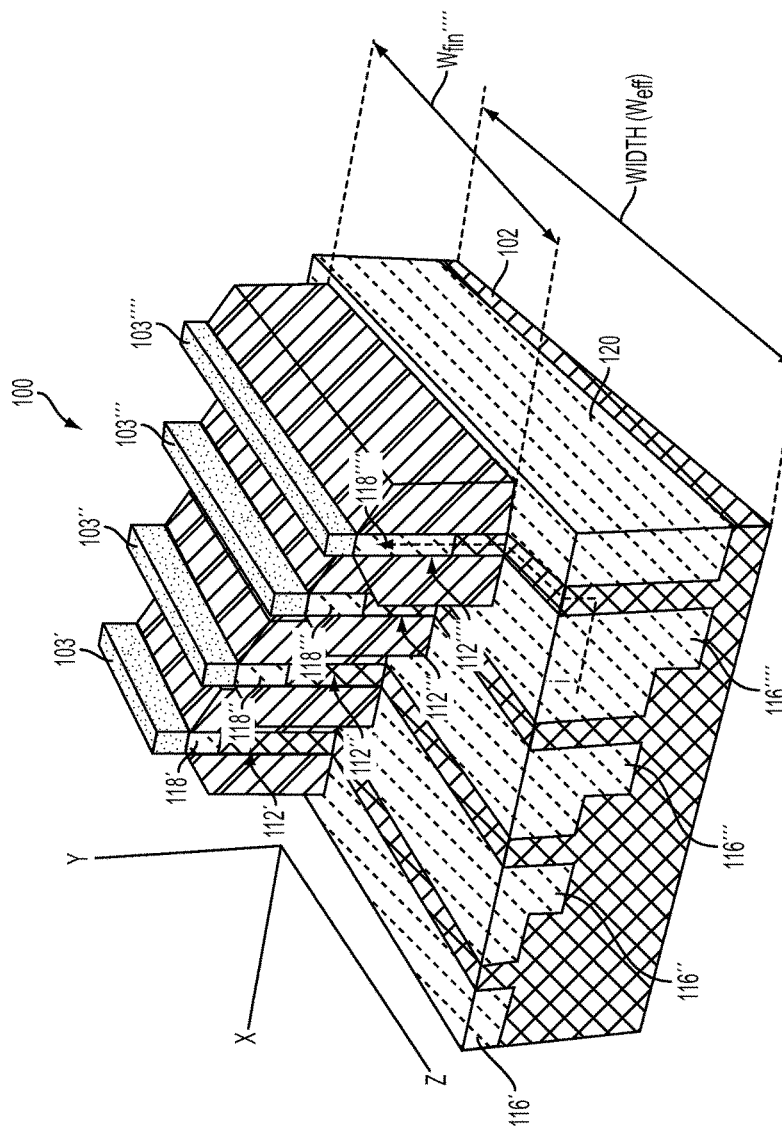

Turning to FIGS. 15A-15B, the polysilicon block layer 124 is patterned to form individual gate stacks 126'-126"". Each gate stack 126'-126"" corresponds to a respective fin 112'-112"". Various gate stack patterning processes may be used to form the individual gate stacks 126'-126"" as understood by those ordinarily skilled in the art. As illustrated in FIGS. 15A-15B, the semiconductor device 100 may be formed as a multi-gate FinFET including at least one fin 112'-112"" having a fin width ($w_{FIN}$) that is different with respect to a $w_{FIN}$ of one or more remaining fins 112'-112"". Accordingly, the drive current provided by the semiconductor device 100 may be more precisely controlled by adjusting $w_{FIN}$ of one or fins 112'-112"", as opposed to adding additional semiconductor fin structures to the semiconductor device.

As further illustrated in FIGS. 15A-15B, the semiconductor device 100 may be formed as a multi-gate FinFET that includes at least one gate channel 122'-122"" that has a gate length ($l_{GATE}$) that is different with respect to a gate length of one or more remaining gate channels 122'-122"". Therefore, unlike a conventional multi-gate FinFET where the current flows in a planar direction and parallel to the gate channel between the source (S) and the drain (D), the current (i) flowing in a multi-gate FinFET formed by semiconductor device 100 flows in a non-planar direction. For example, the current may originate at a first source junction 116', and flow vertically through a first gate channel 122' such that the current is collected by a first drain junction 118'. Therefore, unlike a conventional FinFET device, which flows the current in a planar direction along the length of the substrate perpendicular to the width of the fins (see FIG. 1), the semiconductor device 100 flows the current vertically in a non-planar direction. Although portions of the gate stacks 126'-126"" extending along the height (i.e., the X-axis direction) are shown as etched such that the structure of the corresponding fins 112'-112"" may be shown, it is appreciated that the gate stacks 126'-126"" may fully cover all sides a respective fin 112'-112"".

Figure 16:
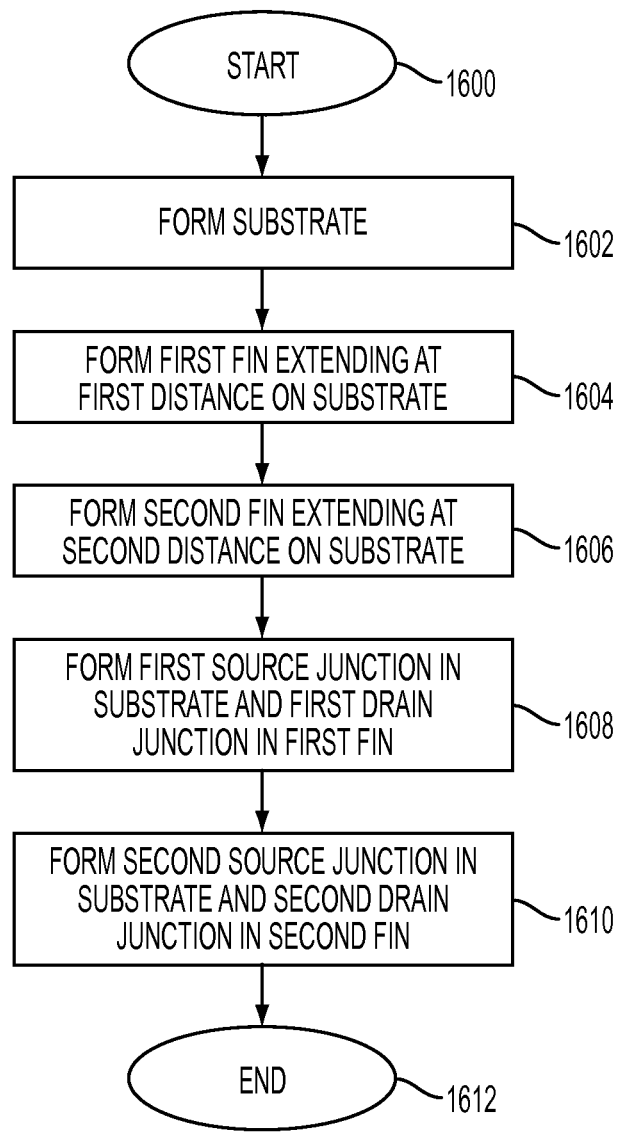
FIG. 16 is a flow diagram illustrating a method of fabricating a semiconductor device according to an exemplary embodiment.

Turning now to FIG. 16, a flow diagram illustrates a method of fabricating a semiconductor device according to an exemplary embodiment. The method begins at operation 1600 and proceeds to operation 1602 to form a substrate. The substrate may extend in a first direction to define a substrate length and a second direction perpendicular to the first direction to define a substrate width. At operation 1604, a first semiconductor fin is formed on an upper surface of the substrate. The first semiconductor fin extends along the substrate width at a first distance to define a first fin width. At operation 1606, a second semiconductor fin is formed on the upper surface of the substrate. The second semiconductor fin extends along the substrate width at a second distance to define a second fin width. In at least one exemplary embodiment, the second distance is different with respect to the first distance. Accordingly, the first and second fin widths are different with respect to one another.

At operation 1608, source/drain junctions of the first semiconductor fin are formed. For example, a first source junction is implanted in the upper surface of the substrate and a corresponding first drain junction is implanted in the first semiconductor fin. It is appreciated that the locations of the first source junction and first drain junction may be interchanged. Accordingly, a first non-planar gate channel is formed between the first source/drain junctions. At operation 1610, source/drain junctions of the second semiconductor fin are formed. For example, a second source junction is implanted in the upper surface of the substrate and a second drain junction is implanted in second semiconductor fin. It is appreciated that the locations of the first source junction and first drain junction may be interchanged. Accordingly, a second non-planar gate channel is formed between the second source/drain junctions, and the method ends at operation 1612. In at least one exemplary embodiment, the depths of the first source/drain junctions are different from the depths of the second source/drain junctions. Accordingly, the first non-planar gate channel may be formed having first gate length, and the second non-planar gate channel may be formed having a second gate length that is different from the first gate length.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor device, comprising:
    a substrate extending in a first direction to define a substrate length and a second direction perpendicular to the first direction to define a substrate width;
    a first semiconductor fin formed on an upper surface of the substrate, an entire base of the first semiconductor fin directly contacting the substrate and extending continuously between a first pair of fin ends along the second direction at a first distance without disengaging the substrate to define a first fin width, a first source/drain junction of the first semiconductor fin formed on the upper surface of the substrate; and
    a second semiconductor fin formed on the upper surface of the substrate, an entire base of second semiconductor fin directly contacting the substrate and extending continuously between a second pair of fin ends along the second direction at a second distance without disengaging the substrate to define a second fin width, a second source/drain junction of the first semiconductor fin formed on the first semiconductor fin,
    wherein the at least one fin end included in the first pair of fin ends is not aligned with at least one fin end included in the second pair of fin ends, and wherein the first and second fins are orientated in parallel arrangement with respect to one another on the substrate, and
    wherein the first and second source/drain junctions define a first gate channel therebetween, the first gate channel being non-planar with respect to at least one of the first and second source/drain junctions.

2. The semiconductor device of claim 1, wherein the first and second fin widths are different with respect to one another to control a drive current flowing of the semiconductor device.

3. The semiconductor device of claim 2, wherein the first fin width is less than the second fin width.

4. The semiconductor device of claim 2, wherein the first fin width is greater than the second fin width.

5. The semiconductor device of claim 1, further comprising a third source/drain junction of the second semiconductor fin formed on the upper surface of the substrate and a fourth source/drain junction of the second semiconductor fin formed on the second semiconductor fin.

6. The semiconductor device of claim 5, wherein the third and fourth source/drain junctions define a second gate channel therebetween, the second gate channel being non-planar with respect to at least one of the third and fourth source/drain junctions.

7. The semiconductor device of claim 6, wherein the first gate channel has a first gate length and the second gate channel has a second gate length that is different from the first gate length.

8. The semiconductor device of claim 7, wherein the second source/drain junction is implanted in an upper surface of the first semiconductor fin at a first depth to define the first gate length, and the fourth source/drain junction is implanted in an upper surface of the second semiconductor fin at a second depth different from the first depth to define the second gate length.

9. A method of fabricating a semiconductor device, the method comprising:
    forming a substrate that extends in a first direction to define a substrate length and a second direction perpendicular to the first direction to define a substrate width;
    forming a first semiconductor fin on an upper surface of the substrate, an entire base of the first semiconductor fin directly contacting the substrate and extending continuously between a first pair of fin ends along the second direction at a first distance without disengaging the substrate to define a first fin width, a first source/ drain junction of the first semiconductor fin formed on the upper surface of the substrate;

forming a second semiconductor fin on the upper surface of the substrate, an entire base of second semiconductor fin directly contacting the substrate and extending continuously between a second pair of fin ends along the second direction at a second distance without disengaging the substrate to define a second fin width, a second source/drain junction of the first semiconductor fin formed on the first semiconductor fin; and forming a first non-planar gate channel between the first and second source/drain junctions, wherein the first and second fins are orientated in parallel arrangement with respect to one another on the substrate, the second semiconductor fin extending between a second pair of fin ends along the second direction at a second distance to define a second fin width, the second distance being different with respect to the first distance such that the at least one fin end included in the first pair of fin ends is not aligned with at least one fin end included in the second pair of fin ends.

10. The method of claim 9, further comprising controlling a drive current flowing through the semiconductor device by varying the first fin width of the first semiconductor fin with respect to the second fin width of the second semiconductor fin.

11. The method of claim 10, further comprising forming the first fin width to be less than the second fin width.

12. The method of claim 10, further comprising forming first fin width to be greater than the second fin width.

13. The method of claim 9, further comprising forming a third source/drain junction of the second semiconductor fin formed on the upper surface of the substrate and forming a fourth source/drain junction of the second semiconductor fin on the second semiconductor fin.

14. The method of claim 13, further comprising forming a second non-planar gate channel between the third and fourth source/drain junctions.

15. The method of claim 14, further comprising forming the first non-planar gate channel to have a first gate length, and forming the second non-planar gate channel to have a second gate length that is different from the first gate length.

16. The method of claim 15, further comprising implanting the second source/drain junction in an upper surface of the first semiconductor fin at a first depth to define the first gate length, and implanting the fourth source/drain junction in an upper surface of the second semiconductor fin at a second depth different from the first depth to define the second gate length.

\* \* \* \* \*